United States Patent [19]

Spencer et al.

[11] Patent Number: 4,776,923
[45] Date of Patent: Oct. 11, 1988

[54] PLASMA PRODUCT TREATMENT APPARATUS AND METHODS AND GAS TRANSPORT SYSTEMS FOR USE THEREIN

[75] Inventors: John E. Spencer, Plano; Scott S. Miller, Austin; Woodie J. Sutton, Denton, all of Tex.; Andrew M. Hoff, State College, Pa.

[73] Assignee: Machine Technology, Inc., Parsippany, N.J.

[21] Appl. No.: 5,034

[22] Filed: Jan. 20, 1987

[51] Int. Cl.$^4$ .................. B44C 1/22; C03C 15/00; C03C 25/06
[52] U.S. Cl. .................. 156/643; 156/646; 156/345; 204/192.32; 204/298
[58] Field of Search .................. 204/164, 192.32, 298; 156/643, 646, 345; 427/38, 39; 118/728, 50.1, 620

[56] References Cited

U.S. PATENT DOCUMENTS

| | | | |
|---|---|---|---|
| 3,837,856 | 9/1974 | Irving et al. | 96/36.2 |
| 3,879,597 | 4/1975 | Bersin et al. | 219/121 P |
| 4,065,369 | 12/1977 | Ogawa et al. | 204/164 |
| 4,123,663 | 10/1978 | Horiike | 250/531 |
| 4,160,690 | 7/1979 | Shibagaki et al. | 156/643 |
| 4,192,706 | 3/1980 | Horiike | 156/643 |
| 4,304,983 | 12/1981 | Pierfederici | 219/121 PG |
| 4,615,756 | 10/1986 | Tsujii et al. | 156/643 X |
| 4,673,456 | 6/1987 | Spencer et al. | 156/345 |

OTHER PUBLICATIONS

Science Magazine, vol. 230, dated Oct. 25, 1985, p. 396.

*Primary Examiner*—William A. Powell
*Attorney, Agent, or Firm*—Lerner, David, Littenberg, Krumholz & Mentlik

[57] ABSTRACT

In semiconductor treatment apparatus with a plasma generating zone, a treatment zone, and a bent path connecting the two so as to block direct transmission of ultraviolet light from the plasma generating zone to the workpiece in the treatment zone, a light trap is provided to suppress indirect transmission of light as by reflection or by transmission within transparent walls of a conduit defining the bent path.

16 Claims, 2 Drawing Sheets

PLASMA PRODUCT TREATMENT APPARATUS AND METHODS AND GAS TRANSPORT SYSTEMS FOR USE THEREIN

BACKGROUND OF THE INVENTION

The present invention relates to treatment of semiconductor wafers with reactive gases formed from a plasma.

Copending, commonly assigned United States patent application Ser. No. 777,032, filed Sept. 17, 1985, U.S. Pat. No. 4,673,456 the disclosure of which is incorporated by reference herein, describes apparatus and methods for treating semiconductor wafers with reactive gases formed from plasmas. These gases are also referred to as "plasma afterglows" or "plasma products." As set forth in Ser. No. 777,032 application, a semiconductor wafer may be positioned within a reaction chamber and a gas containing oxygen and/or nitrous oxide downstream through a conduit to the reaction chamber. The conduit extends through a microwave reactor. In the reactor, microwave energy is applied to the gas passing through the conduit to convert the gas to a plasma as it passes through the plasma section of the conduit disposed in the microwave reactor. The plasma forms reactive gas species which pass downstream to the chamber containing the wafer and strips photoresist from the wafer. Reactive species created in substantially the same way can also be used in an anisotropic etching process also disclosed in Ser. No. 777,032 application. In the etching process, additional energy such as radio frequency energy is applied to the reactive species in the chamber containing the workpiece, so as to form ions and to bombard the workpiece with these ions. Radiant energy such as ultraviolet light typically is emitted by the plasma within the plasma section of the conduit. Semiconductor wafers and photoresists used thereon may be adversely affected by radiant energy. As described in Ser. No. 777,032 application, the conduit is provided with bends between the plasma section and the downstream end of the conduit. The bends in the path between the plasma section of the conduit and the workpiece-holding chamber preclude direct line of sight transmission of radiant energy from the plasma within the plasma section to the workpiece.

Other plasma treatment methods and apparatus wherein the gas is conveyed through a bent conduit from the plasma section to the wafer are disclosed in U.S. Pat. Nos. 3,837,856; 4,192,706; 4,123,663; 4,065,369; and 4,160,690. The conduits employed in a plasma treatment apparatus typically are formed from transparent or translucent materials such as fused silica, borosilicate glass, or alumina, as these materials resist reaction with the plasma and with the reactive species formed from the plasma. U.S. Pat. No. 4,304,983 discloses a treatment apparatus and method wherein the wafer is disposed in the central region of a chamber, the gas is converted to a plasma by an electrical discharge in a peripheral region of the chamber, and a series of baffles are provided between the central and peripheral regions of the chamber. These baffles likewise provide a path having at least one bend between the plasma generation section of the apparatus and the workpiece holding section so as to prevent direct, line of sight transmission of ultraviolet light from the plasma to the wafers.

SUMMARY OF THE INVENTION

The present invention incorporates the realization that radiant energy, and particularly ultraviolet light, may pass from the plasma in the plasma generation section to the wafer via indirect modes of transmission, i.e., modes other than direct, line of sight transmission. It has now been found that such indirectly transmitted energy may damage the workpieces. This aspect of the present invention incorporates the realization that significant quantities of ultraviolet light may pass from the plasma section to the workpiece by reflection along a bent path. In particular, it has been found according to the present invention that significant quantities of ultraviolet light may be transmitted around bends in a gas conduit having transparent or translucent walls by internal reflection and/or refraction within the walls.

One aspect of the present invention provides apparatus for treating a semiconductor wafer with plasma products. The treatment apparatus according to this aspect of the present invention may include means for retaining a wafer at a workpiece location, means for generating a plasma at a plasma generation location remote from the workpiece location and means defining a path having at least one bend between the plasma generation location and the workpiece location. The bend in the path permits passage of plasma products from said plasma generation location to the workpiece location but blocks direct line of sight transmission of radiant energy from the plasma generation location to the workpiece location. Apparatus according to this aspect of the present invention also includes suppressor means for suppressing indirect transmission of radiant energy from the plasma generation location to the workpiece location. Most preferably, the suppressor means includes means for suppressing transmission of radiant energy such as ultraviolet light from the plasma generation location to the workpiece location by reflection along the path.

The apparatus preferably includes a gas conducting conduit having upstream and downstream ends, a plasma section, and at least one bend disposed between the plasma section and the downstream end. The plasma section of the conduit may be engaged with discharge energy means for applying energy to gas as the gas passes through the plasma section of the conduit so as to convert the gas into a plasma in the plasma section. The downstream end of the conduit preferably is connected to a treatment chamber, and appropriate means are provided for holding one or more workpiece in the treatment chamber so that workpieces within the chamber will be exposed to plasma products formed from the plasma generated in the plasma section. Thus, the plasma section of the conduit constitutes the plasma generation location, whereas the chamber constitutes the workpiece location and the bend in the conduit forms the path between these locations. In apparatus incorporating these features, the suppressor means preferably includes means for suppressing transmission of radiant energy around the bend in the conduit.

Where the wall of the conduit is transparent or translucent, the suppressor means most preferably includes means for inhibiting transmission of radiant energy within the conduit wall from the plasma section to the downstream end of the conduit. Preferably, the suppressor means includes a trap tube intersecting the conduit at the bend. Thus, the bend may be defined by a first bend section of the conduit extending downstream in a first direction, and a second bend section of a conduit intersecting the first bend section and extending downstream from the intersection in a second direction, transverse to the first direction. The trap tube most preferably intersects the conduit at or adjacent the intersection of the first or second sections, and projects from the intersection substantially in the first direction. The trap tube most preferably is blocked or plugged at its distal end remote from the intersection. The trap tube thus constitutes an extension of the first bend section, and the second bend section may be regarding as branching off transverse to the conjoined first section and trap tube. Because there is no tube wall extending across the first section at the intersection, radiant energy propagated downstream through the interior of the first bend section tends to pass into the trap tube rather than to be reflected into the second bend section. Moreover, radiant energy passing downstream within the wall of the first bend section also tends to pass into the trap tube, rather than to pass around the bend into the wall of the second bend section. The trap tube most preferably is provided with means for suppressing reflection of radiant energy back along the trap tube from its distal end to the bend. For example, the trap tube may be provided with a roughened surface, a light absorbing coating on its exterior or both for dispersing and absorbing radiant energy.

A further aspect of the present invention provides the gas conduit system for use in plasma product treatment apparatus. The conduit system preferably includes the bend and suppressor means mentioned above.

Yet another aspect of the present invention provides methods of treating a semiconductor wafer with plasma products. In the preferred methods, gas is directed through a plasma generation location to a workpiece location via a path having at least one bend, and the gas is exposed to energy at the plasma generation location to form the plasma. Direct, line of sight transmission of radiant energy from the plasma generation location to the workpiece is inhibited by the bend in the path. The method most preferably includes the further step of suppressing indirect transmission of radiant energy from the plasma generation location to the workpiece location, as by suppressing reflection along the bent path. Because the wafer is effectively protected from radiant energy transmitted indirectly as well as by direct, line of sight transmission, the process can be conducted without damage to the wafer.

These and other objects, features, and advantages of the present invention will be more readily apparent from the detailed description of the preferred embodiments set forth below, taken in conjunction with the accompanying drawings.

DETAILED DESCRIPTION OF THE PREFERRED EMBODIMENT

Figure 1:
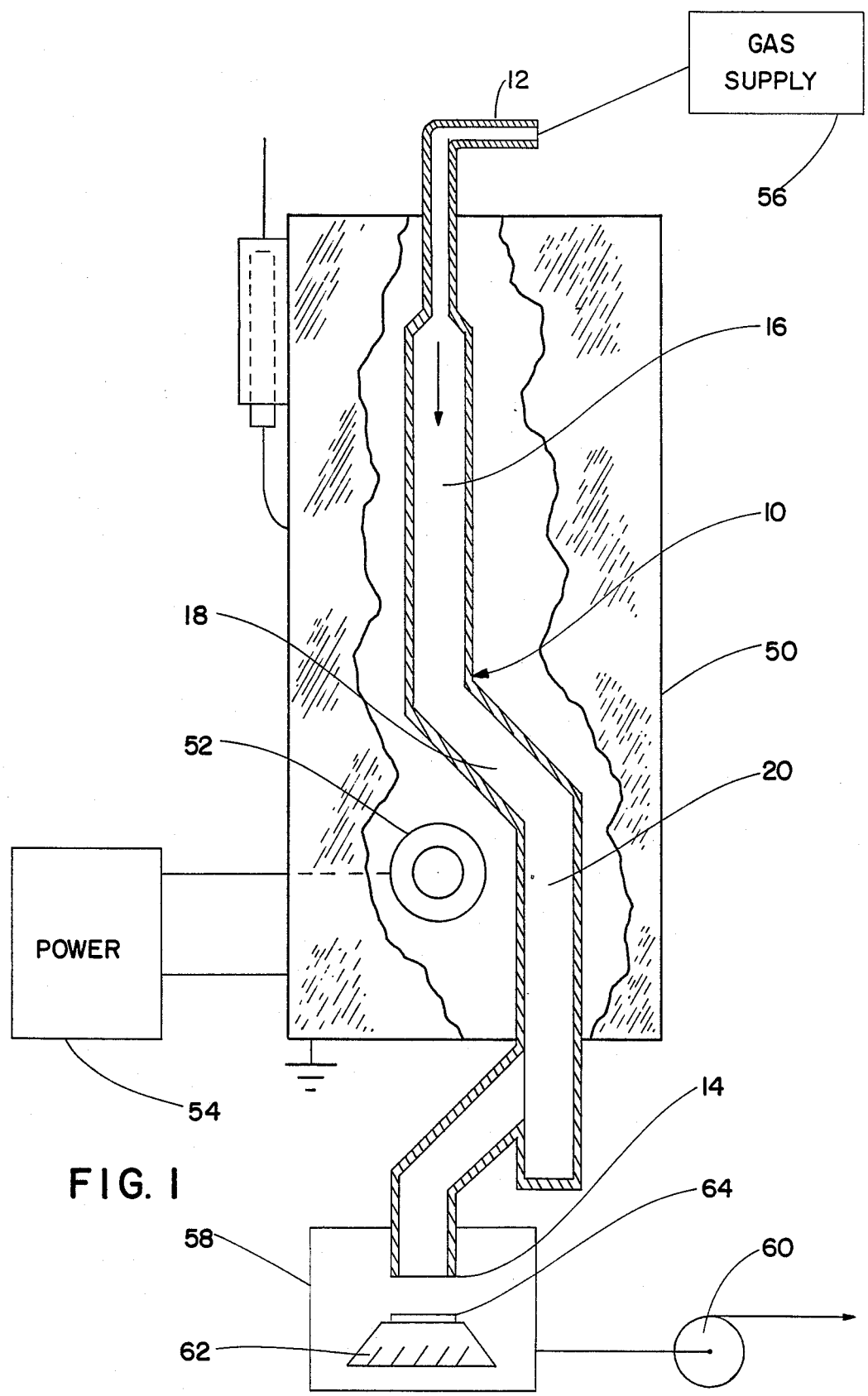
FIG. 1 is a schematic view of the apparatus according to one embodiment of the present invention, with portions removed for clarity of illustration.
Figure 2:
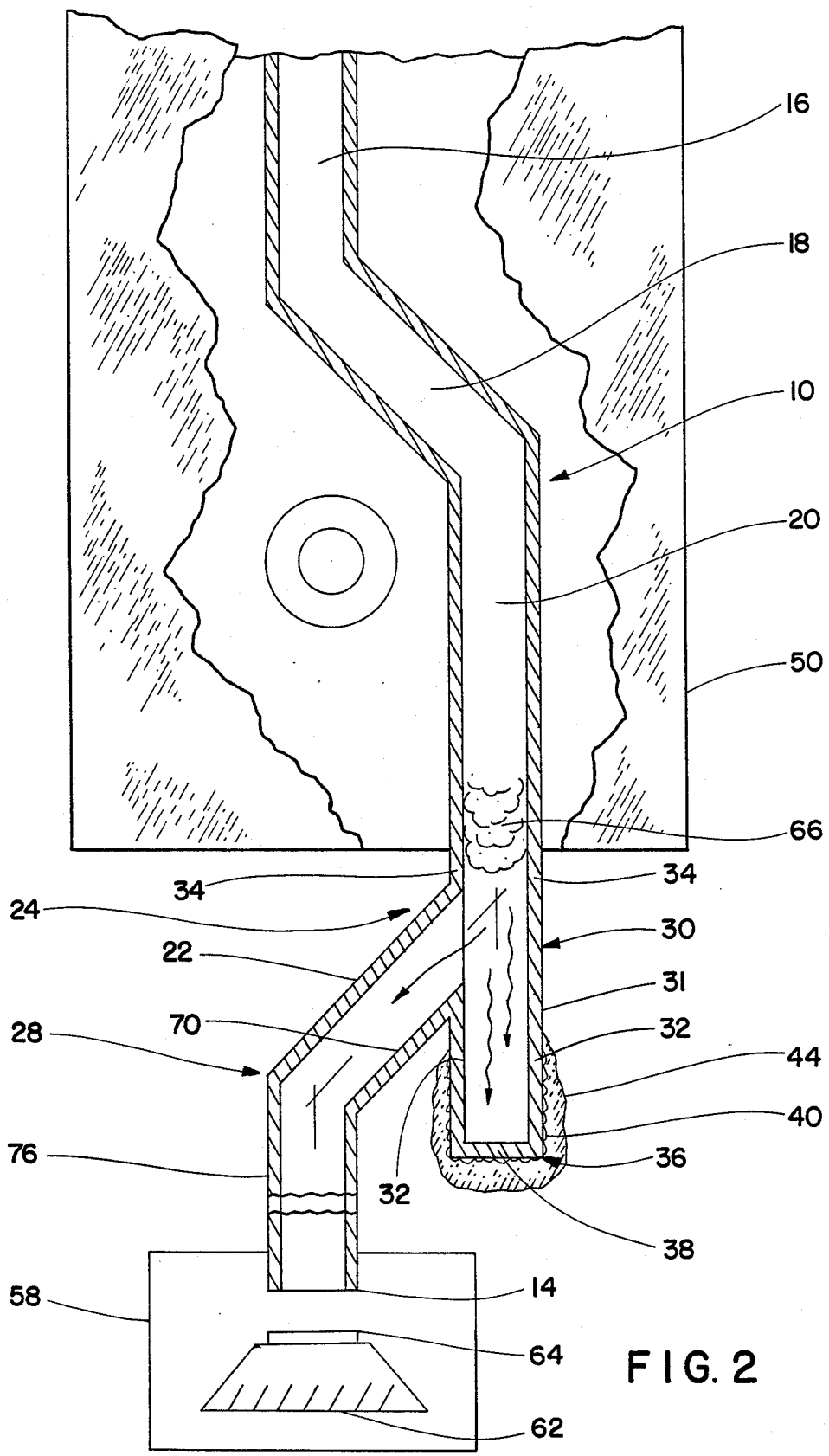
FIG. 2 is a fragmentary schematic view on an enlarged scale of the apparatus shown in FIG. 1.

Apparatus according to one embodiment of the present invention includes an elongated hollow conduit 10 having an upstream end 12 and a downstream end 14. Conduit 10 is a unitary structure with walls of fused quartz. The conduit includes a straight run 16 and a leg 18 extending at an obtuse angle from the downstream end of run 16. Conduit 10 also includes a further run 20 intersecting leg 18 at the downstream end thereof and projecting from that intersection parallel to straight run 16. A further leg 22 intersects run 20 at an obtuse angle, so that leg 22 extends transverse to run 20. Thus, the downstream portion of run 20 and leg 22 cooperatively define a bend 24. Run 20 constitutes a first or upstream conduit section defining the bend, whereas leg 22 constitutes the second or downstream section defining the bend. An outlet run 26 extending parallel to runs 20 and 16 intersects leg 22 and extends downstream from that intersection so that outlet run 26 defines the downstream end 14 of the conduit. A hollow trap tube 30 intersects and communicates with conduit 10 at the intersection of run 20 and leg 22, so that trap tube 30 intersects the conduit at bend 24. The proximal end 31 of trap tube 30, adjacent the intersection, has the same cross-sectional dimensions as run 20, and the trap tube is also coaxial with run 20. The bounding walls 32 of trap tube 30 are integral extensions of the bounding walls 34 of run 20. Thus, trap tube 30 may be considered as an integral extension of run 20.

Trap tube 30 has a distal end 36 remote from the intersection of the trap tube and the conduit. The distal end of the trap tube is closed by a plate 38 integral with bounding walls 32. Walls 32 and plate 38 are formed from the same fused quartz material as the walls of the conduit 10. The exterior surfaces 40 of the trap tube bounding walls 32, and the exterior surface of plug 38 are roughened and covered with a black, light absorbing coating 44.

As shown in FIG. 1, run 16, leg 18 and the upstream portion of run 20 may be engaged within the metallic resonant housing 50 of a microwave reactor. Thus, the dimensions and configuration of run 16, leg 18 and run 20 preferably are selected so that these features match the mountings provided in the microwave reactor. The microwave is provided with a microwave emitter of the type known as a magnetron launcher 52 and a power supply 54. As set forth in greater detail in the aforementioned U.S. patent application Ser. No. 777,032, microwave emitter 52 desirably is arranged to project microwaves along the long axis of straight run 16. As also set forth in Ser. No. 777,032 application, the diameter and configuration of those portions of the conduit so engaged in the microwave reactor are selected to facilitate tuning of the microwave system.

A gas supply apparatus 56 is connected to the upstream end 12 of conduit 10, whereas a treatment chamber 58 is connected to the downstream end 14 of the conduit. A vacuum pump 60 is connected to chamber 58, and a support 62 is mounted within treatment chamber 58. Support 62 is adapted to engage and hold one or more semiconductor wafers 64. Depending upon the treatment process to be conducted, appropriate means (not shown) may be provided for controlling the temperature of the wafer, for applying radio frequency electric fields within the chamber, and for performing other operations associated with plasma product treatment of semiconductor wafers.

In a process according to one embodiment of the present invention, a gas is directed downstream through conduit 10 from gas supply means 56. Power source 54 and microwave emitter 52 are actuated to apply microwave energy to the gas as the gas passes downstream through the conduit. This energy converts the gas into a plasma, i.e., a substantially ionized gas. The plasma is present in those sections of the conduit exposed to the microwave energy, i.e., in those sections of the tube disposed within metallic housing 50. As the gas passes along run 20 beyond the housing 50, it reverts from the plasma state to a substantially non-ionized gaseous state. However, the gas passing downstream beyond this point contains reactive species such as monatomic oxygen or the like. These reactive gaseous products formed from the plasma pass downstream through leg 22 and outlet run 26 into chamber 58, where they contact the wafer 64. Depending on the composition of the gas supplied, the nature of the reactive gaseous products and the conditions prevailing within the chamber 58, these reactive gaseous products may be used to etch the exposed surface of wafer 64 or to react with a photoresist or masking layer so as to remove the photoresist or masking layer from the wafer.

The plasma 66 within the upstream portion of run 20 and the other portions of conduit 10 disposed inside housing 50 emits radiant energy, and particularly ultraviolet light. Bend 24 is disposed downstream of the plasma containing sections of the conduit. Thus, bend 24 substantially blocks direct, line of sight transmission of the ultraviolet light from the plasma to the downstream end of the conduit and hence blocks direct, line of sight transmission of the ultraviolet light from plasma 66 to wafer 64. Further, bend 26 also blocks direct, line of sight transmission in similar fashion. Although the walls of conduit 10 are transparent, direct line of sight transmission via paths outside the conduit typically does not pose a serious problem. Thus, although some ultraviolet light can theoretically pass along a direct line out of the conduit upstream of bend 24, through the outside atmosphere and back into the conduit adjacent downstream end 14, the amount of light actually traversing such a path will be minimal, as the opaque walls of housing 50 and chamber 58 will limit this form of transmission. Opaque baffles outside of the conduit or an opaque coating on the outside surfaces of the conduit adjacent the downstream end can be provided to further reduce such outside, line of sight transmission.

Trap tube 30 and the associated features act to suppress indirect transmission of ultraviolet light around bend 24 and hence to block indirect transmission of ultraviolet light to the downstream end of the conduit and the wafer. Thus, ultraviolet light passing along the interior of run 20 passes directly into the interior of trap tube 30, and out through the bounding walls 32 of the trap tube and the distal end plug 38. This light is scattered by the roughened surface 40 and absorbed by coating 44. As will be appreciated with reference to FIG. 3, the bounding wall 70 of leg 22 does not extend across the interior bore of conduit run 20. Therefore, ultraviolet light passing through the interior of run 20 will not encounter the bounding wall 70 of the intersecting leg 22 and hence will not be substantially reflected around the bend by the interior surface of the wall 70. Other portions of the ultraviolet light emitted by plasma 66 pass downstream along run 20 through the bounding walls 34 of run 20 by internal reflection and/or refraction within these bounding walls. This portion of the light tends to pass into the bounding walls 32 of the trap tube, where it is scattered by the roughened surfaces 40 and absorbed by coating 44. Thus, the trap tube 30 inhibits transmission of ultraviolet light around bend 24 by reflection and/or refraction within the walls of conduit 10.

Because both direct, line of sight transmission and indirect transmission of ultraviolet light from the plasma 66 to the workpiece are substantially blocked, the workpiece or wafer 64 is well protected from damage caused by ultraviolet light. The trap tube 30 and associated features do not have any appreciable influence on conduction of gas through and along the conduit, or on tuning of the microwave reactor. The gas flow is substantially the same as that prevailing in an otherwise similar system where there is no trap tube.

Numerous variations and combinations of the features described above can be utilized without departing from the present invention as described in the claims. For example, the distal end of the trap tube may be bent and/or tapered. Also, an additional trap tube can be provided at the second bend 28. Similar measures for impeding indirect ultraviolet light transmission can be used in other plasma product treatment systems. As these and other variations can be employed, the foregoing description of the preferred embodiments should be taken as illustrating rather than as limiting the invention as defined in the claims.

What is claimed is:

1. Apparatus for treating a semiconductor wafer with plasma products comprising:
   (a) structure defining a workpiece location, a plasma location and a hollow conduit having at least one bend between said plasma location and said workpiece location;
   (b) holding means for holding a semiconductor wafer at said workpiece location;
   (c) plasma generating means for converting a gas to a plasma at said plasma location so that plasma products formed from said plasma pass along said conduit to said workpiece location and said plasma emits radiant energy at said plasma location, whereby said bend in said conduit will suppress direct, line of sight transmission of said radiant energy to said workpiece location; and
   (d) suppressor means for suppressing indirect transmission of said radiant energy from said plasma location to said workpiece location, said bend including a first section of said conduit extending in a first direction and a second section of said conduit intersecting said first section and extending therefrom in a second direction transverse to said first direction, said suppressor means including a hollow trap tube intersecting and communicating with said conduit at the intersection of said first and second sections.

2. Apparatus as claimed in claims 1 wherein said structure includes a treatment chamber and said hollow conduit has an upstream end, a downstream end and a plasma section between said ends, said bend being disposed between said plasma section and said downstream end, said downstream end of said conduit being connected to said treatment chamber, said plasma generating means including gas supply means for passing a gas downstream through said conduit.

3. Apparatus as claimed in claim 2 wherein said conduit has a wall transparent or translucent to said radiant energy, and said suppressor means includes means for inhibiting passage of said radiant energy from said plasma section to said downstream end within said wall.

4. Apparatus as claimed in claim 1 wherein said trap tube has a distal end remote from said intersection, said suppressor means including means for inhibiting reflection of said radiant energy along said trap tube from said distal end towards said intersection.

5. Apparatus as claimed in claim 4 wherein said first and second sections of said conduit intersect one another at an obtuse angle.

6. Apparatus as claimed in claim 5 wherein said trap tube has a proximal section adjacent said intersection, said proximal section of said trap tube being substantially coaxial with said first section of said conduit.

7. Apparatus as claimed in claim 4 wherein said first and second sections of said conduit and said trap tube each have bounding walls transparent or translucent to said radiant energy, said bounding walls of said trap tube merging with said bounding walls of said first section.

8. Apparatus as claimed in claim 7 wherein said suppressor means includes means for inhibiting internal reflection of said radiant energy within said bounding walls of said trap tube.

9. Apparatus as claimed in claim 8 wherein said means for inhibiting internal reflection within said bounding walls of said trap tube includes a roughened surface covering at least a portion of said bounding walls of said trap tube.

10. Apparatus as claimed in claim 8 wherein said means for inhibiting internal reflection within the walls of said trap tube includes a coating capable of absorbing said radiant energy covering at least a portion of the exterior surfaces of said bounding walls of said trap tube.

11. Apparatus as claimed in claim 2 wherein said conduit has a second bend downstream of the firstsaid bend.

12. Apparatus as claimed in claim 11 wherein said conduit includes a third section between said second section and said downstream end, said third section intersecting said second section and extending downstream therefrom in a direction substantially parallel to said first direction.

13. A gas conduit system for use in plasma product treatment systems comprising:
(a) a hollow conduit having an upstream end, a downstream end adapted for connection to a workpiece holding chamber, and a plasma section between said ends adapted for engagement with discharge energy apparatus so that a plasma can be formed in said plasma section when gas is passed downstream through the conduit, whereby radiant energy will be emitted in said plasma section, said conduit also having a bend between said plasma section and said downstream end for preventing direct line of sight transmission of said radiant energy from said plasma section to said downstream end, and
(b) suppressor means for suppressing passage of said radiant energy from said plasma section to said downstream end, said suppressor means including a hollow trap tube intersecting and communicating with said conduit at said bend.

14. Apparatus for treating a workpiece with plasma products comprising:
(a) structure defining a workpiece location, a plasma location and a hollow conduit having at least one bend between said plasma location and said workpiece location;
(b) holding means for holding a workpiece at said workpiece location;
(c) plasma generating means for converting a gas to a plasma at said plasma location so that plasma products formed from said plasma pass along said conduit to said workpiece location and said plasma emits radiant energy at said plasma location, whereby said bend in said conduit will suppress direct, line of sight transmission of said radiant energy to said workpiece location; and
(d) suppressor means for suppressing indirect transmission of said radiant energy from said plasma location to said workpiece location, said suppressor means including a hollow trap tube intersecting and communicating with said conduit at said bend.

15. A method of treating a workpiece with plasma products comprising the steps of directing a gas downstream through a hollow conduit having at least one bend to a workpiece location while maintaining the workpiece at said workpiece location, converting the gas to a plasma as the gas passes through a plasma section upstream of the bend and remote from said workpiece location, whereby radiant energy will be evolved in said plasma section and direct line of sight transmission of the radiant energy to the workpiece location will be impeded by the bend in the conduit, and suppressing indirect transmission of radiant energy from said plasma location to said workpiece location by trapping at least some of said radiant energy in a hollow trap tube intersecting said conduit at said bend.

16. A method as claimed in claim 15 wherein said workpiece is a semiconductor wafer.

* * * * *